(12) United States Patent
Yono et al.

(10) Patent No.: US 8,293,668 B2
(45) Date of Patent: Oct. 23, 2012

(54) DIELECTRIC CERAMIC COMPOSITION

(75) Inventors: Kentei Yono, Tsukuba (JP); Atsunobu Masuno, Tokyo (JP); Shinichi Yoda, Tukuba (JP); Hidesada Natsui, Tokyo (JP)

(73) Assignees: Japan Aerospace Exploration Agency, Tokyo (JP); TDK Corporation, Tokyo (JP)

( * ) Notice: Subject to any disclaimer, the term of this patent is extended or adjusted under 35 U.S.C. 154(b) by 39 days.

(21) Appl. No.: 12/991,601

(22) PCT Filed: May 15, 2008

(86) PCT No.: PCT/JP2008/058951
§ 371 (c)(1),
(2), (4) Date: Nov. 8, 2010

(87) PCT Pub. No.: WO2009/136449
PCT Pub. Date: Nov. 12, 2009

(65) Prior Publication Data
US 2011/0059838 A1   Mar. 10, 2011

(30) Foreign Application Priority Data
May 9, 2008 (JP) .................... PCT/JP2008/058653

(51) Int. Cl.
*C04B 35/468* (2006.01)
(52) U.S. Cl. .................................. 501/137; 501/139 M
(58) Field of Classification Search ........... 501/137–139
See application file for complete search history.

(56) References Cited

U.S. PATENT DOCUMENTS

| | | | |
|---|---|---|---|
| 7,049,258 B2 * | 5/2006 | Ohsato et al. | 501/139 |
| 7,544,245 B2 | 6/2009 | Yono et al. | |
| 2004/0242403 A1 * | 12/2004 | Ohsato et al. | 501/139 |
| 2005/0199180 A1 * | 9/2005 | Yono et al. | 117/2 |
| 2011/0059838 A1 * | 3/2011 | Yono et al. | 501/137 |
| 2011/0110017 A1 * | 5/2011 | Natsui et al. | 361/321.1 |
| 2011/0110018 A1 * | 5/2011 | Ishii et al. | 361/321.5 |

FOREIGN PATENT DOCUMENTS

| | | | |
|---|---|---|---|
| JP | 722022507 | * | 10/1972 |
| JP | A-2005-053726 | | 3/2005 |
| JP | A-2005-213083 | | 8/2005 |

OTHER PUBLICATIONS

Jayanthi et al., "Dielectric properties of 3d transition metal substituted $BaTiO_3$ ceramics containing the hexagonal phase formation," *J. Mater. Sci: Mater. Electron*, vol. 19, No. 7, Dec. 22, 2007, pp. 615-626.

Yono, Kentei, "Giant Dielectric Response of La Doped $h$-$BaTiO_3$ Single Crystal," *The Physical Society of Japan*, vol. 63, No. I, Separate vol. 4, Feb. 29, 2008, p. 949.

International Preliminary Report on Patentability issued in Application No. PCT/JP2008/058951; Dated Dec. 13, 2010.

International Search Report issued in Application No. PCT/JP2008/058951; Dated Aug. 5, 2008 (With Translation).

* cited by examiner

*Primary Examiner* — Karl Group
(74) *Attorney, Agent, or Firm* — Oliff & Berridge, PLC

(57) ABSTRACT

Dielectric ceramic composition comprising a barium titanate including barium titanate having hexagonal structure as a main component, and an element "M", an effective ionic radius of the "M" is within ±20% with respect to an effective ionic radius of 12-coordinated $Ba^{2+}$ or with respect to an effective ionic radius of 6-coordinated $Ti^{4+}$, an ionic valence of the "M" is larger than that of the Ba or Ti.

3 Claims, 2 Drawing Sheets

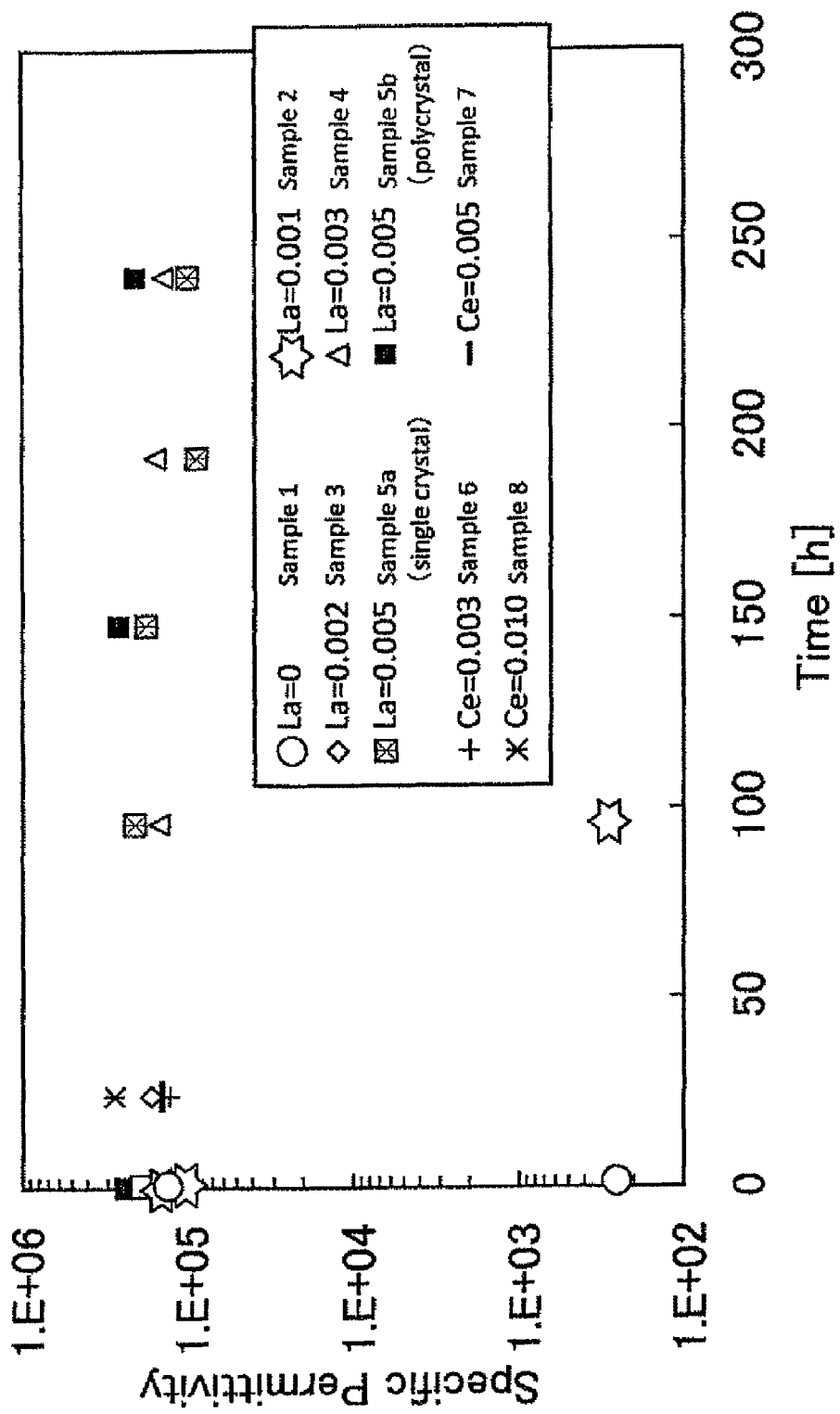

DIELECTRIC CERAMIC COMPOSITION

TECHNICAL FIELD

The present invention relates to a dielectric ceramic composition, more precisely, relates to a dielectric ceramic composition having extremely high specific permittivity.

BACKGROUND OF THE INVENTION

In recent years, electric apparatus and electronic apparatus have been rapidly downsized with higher performance. Along with that, demands for downsizing electronic component with a larger capacity and higher reliability used for such apparatuses have been increased. A ceramic capacitor as one example of electronic components is not exception of this.

As for one of the measures for fulfilling such demands, it has been considered to make permittivity of dielectric material higher. Currently, as for barium titanate which is widely used as dielectric material showing the high permittivity, the barium titanate having perovskite type crystal structure (tetragonal form, cubic form) is the mainstream, which shows about several thousands of specific permittivity at room temperature. On the other hand, barium titanate having hexagonal structure (hexagonal barium titanate) was not much used as a dielectric material, because permittivity (about 400) thereof is lower than that of the perovskite type barium titanate in using temperature range.

However, Patent Documents 1 and 2 disclose that hexagonal bariumtitanate (h-$BaTiO_3$) to which oxygen vacancy is introduced by using containerless solidification method shows extremely high specific permittivity which is 100000 or more at room temperature.

However, it has been difficult to control oxygen vacancy amount, because it is necessary to set the reducing atmosphere strictly. Also, it is considered that the oxygen vacancy itself is one of the factors to deteriorate lifetime, therefore it has been considered as difficult to use electronic components stably in which the oxygen-deficient hexagonal barium titanate is used.

Further, in the case of applying such the dielectric material having high specific permittivity to electronic components such as a ceramic capacitor and the like, annealing (reoxidazing) treatment is necessary. However, when the annealing treatment is performed to the above mentioned oxygen-deficient hexagonal barium titanate, oxygen is replenished, as a result, there was a problem that the specific permittivity has rapidly decreased in extremely short time.

Patent Document 1: Japanese Patent No. 3941871
Patent Document 2: Japanese Patent No. 4013226

DISCLOSURE OF THE INVENTION

Problems to be Solved by the Invention

The present invention has been made by considering such situation, and a purpose is to provide dielectric ceramic composition which maintains extremely high specific permittivity even if the annealing treatment is performed and is preferable to use various electronic components, sensors and the like.

Means for Solving the Problems

In order to achieve the above mentioned purpose, as a result of intentional study by the present inventors, the present inventors have solved a mechanism to generate huge specific permittivity in the oxygen-deficient hexagonal barium titanate and based on the obtained discovery, the present invention has been completed by finding the high specific permittivity can be maintained by having an element included to Ba and Ti composing barium titanate under a certain condition in a certain amount, even though after annealing treatment.

Namely, dielectric ceramic composition of the present invention comprising
a barium titanate including a barium titanate having hexagonal structure as a main component, and
an element "M", wherein
an effective ionic radius of said "M" is within ±20% with respect to an effective ionic radius of 12-coordinated $Ba^{2+}$ or with respect to an effective ionic radius of 6-coordinated $Ti^{4+}$, and
an ionic valence of said "M" is larger than an ionic valence of said Ba or Ti.

It has been considered that the reason that the oxygen-deficient hexagonal barium titanate shows extremely high specific permittivity is as follows. When oxygen vacancy is introduced to the hexagonal barium titanate, Ti ion is reduced from quadrivalent to trivalent in order to compensate this, and performs electric conductivity. Therefore, that is due to the non-uniform existence of two regions which show different electrical property (a semiconductor property region and a region of insulation).

In the present invention, the huge specific permittivity is realized by introducing element "M" having the above mentioned effective ion radius instead of introducing oxygen vacancy to hexagonal barium titanate so as to reduce Ti ion from quadrivalent to trivalent. Also, when annealing the oxygen-deficient hexagonal barium titanate, the oxygen is replenished, the specific permittivity decreases rapidly, because reduction of Ti ion is not occurred. On the other hand, in the present invention, the Ti ion is reduced by having "M" included. Therefore, even when the annealing is performed, the occurred huge specific permittivity can be maintained. Alternatively, it is available to suppress descend of the specific permittivity.

Preferably, the "M" is included in a content of more than 0 mole to 10 moles or less with respect to 100 moles of the dielectric ceramic composition. By setting the content of the "M" within the above mentioned range, the effects of the present invention can be improved further.

Preferably, the "M" is at least one selected from La, Ce, Bi and V. By selecting the "M" from the above mentioned elements, the effects of the present invention can be improved further.

As for usage of the dielectric ceramic composition according to the present invention, although it is not particularly limited as far as a usage requires high dielectric constant, it is preferable to the dielectric ceramic composition used for electronic components such as an oxygen sensor, a semiconductor, ceramic capacitor and the like.

EFFECTS OF THE INVENTION

According to the present invention, extremely high specific permittivity (for example, 10000 or more) can be occurred by including the "M" which fulfills the above condition in the hexagonal barium titanate. Further, even though annealing treatment is performed to the hexagonal barium titanate which includes the "M", the occurred specific permittivity can be maintained. Alternatively, it is available to suppress descent of the specific permittivity.

Because the dielectric ceramic composition of the present invention has an extremely high specific permittivity, it is preferable for purposes of use which require high specific permittivity. Further, because descent of the specific permittivity by the annealing treatment is suppressed, it is preferable to a dielectric layer of electronic components such as a capacitor and the like for which the annealing treatment is necessary.

BRIEF EXPLANATION OF DRAWINGS

FIG. 2 is a graph showing relation of annealing treatment time and specific permittivity with respect to samples according to examples and comparative examples of the present invention.

EXPLANATION OF NUMERAL REFERENCES

Figure 1:
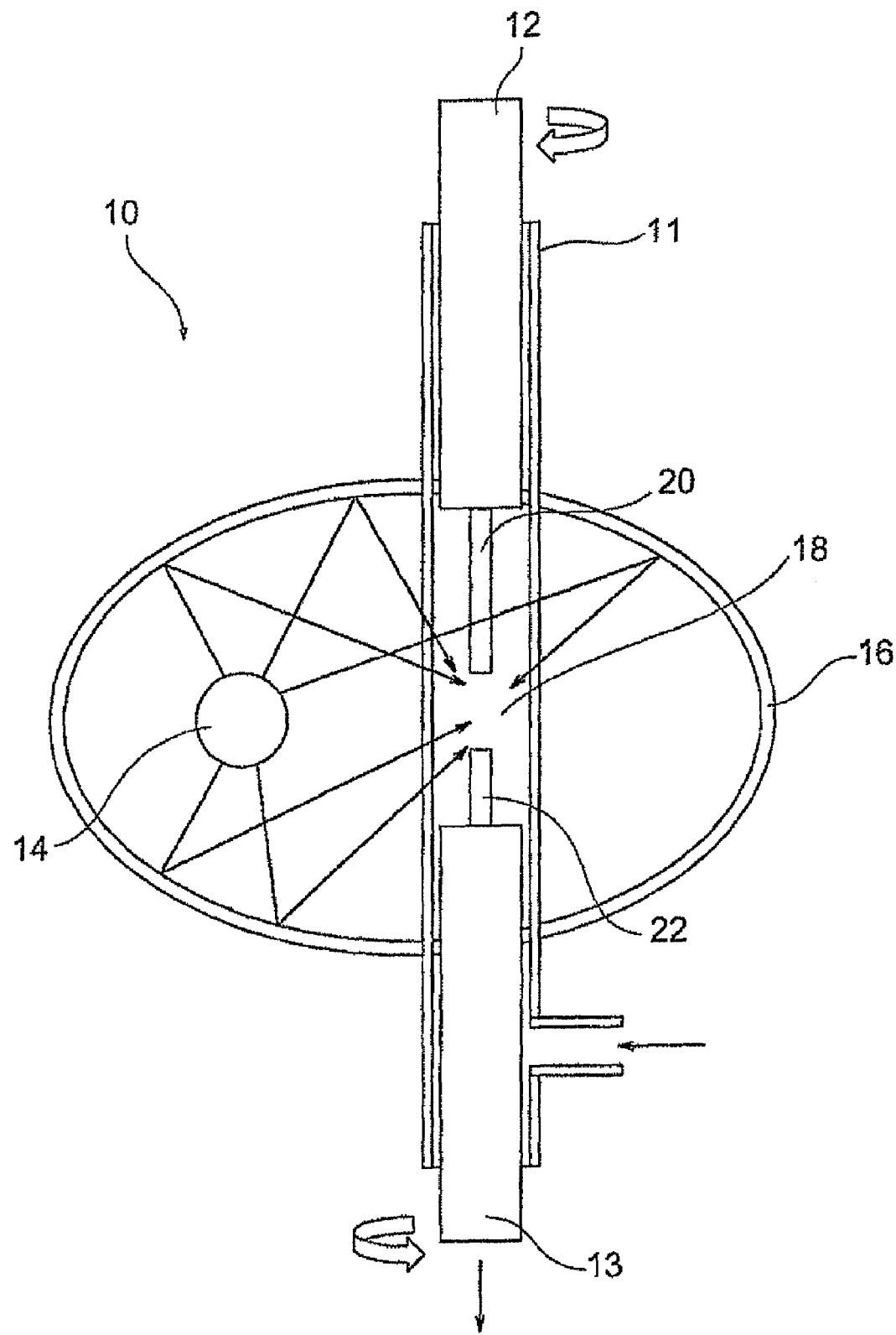
FIG. 1 is a schematic view of an infrared ray image furnace used for manufacturing dielectric ceramic composition of the present invention.

10 . . . Infrared ray image furnace
11 . . . Quartz tube
12 . . . Upper shaft
13 . . . Lower shaft
14 . . . Halogen lamp
16 . . . Rotary ellipsoidal mirror
18 . . . Melting zone
20 . . . Calcined body
22 . . . Single crystal

BEST MODE FOR WORKING THE INVENTION

Below, the present invention will be explained based on examples shown in drawings.

Dielectric Ceramic Composition

Initially, the dielectric ceramic composition of the present invention includes a barium titanate having a hexagonal structure.

The barium titanate having the hexagonal structure (hexagonal barium titanate) is shown by a general formula of h-$BaTiO_3$. Although the hexagonal barium titanate has a high temperature stable phase at 1460° C. or higher, the hexagonal barium titanate can be existed by rapidly cooling from this temperature, even at room temperature. However, the specific permittivity thereof is low.

On the other hand, barium titanate used as dielectric layer for electronic components has a perovskite structure normally. In the barium titanate having the perovskite structure, a tetragonal form and a cubic form exist due to different lengths of an a-axis and a c-axis, the both forms show the higher specific permittivity than the hexagonal barium titanate.

In the dielectric ceramic composition of the present embodiment, the hexagonal barium titanate is a main component of the barium titanate. Specifically, the hexagonal barium titanate is included in a content of preferably 50 mass % or more, more preferably 90 mass % or more, further preferably 95 mass % or more with respect to whole barium titanate included in the dielectric ceramic composition of the present embodiment. Note that in a method of producing hexagonal barium titanate which will be mentioned below, there may be sometimes that barium titanate of a tetragonal form and that of a cubic form are included. However, the hexagonal barium titanate is included in the dielectric ceramic composition within the above mentioned range.

The dielectric ceramic composition of the present invention further includes an element "M". An effective ionic radius of the element "M" is within ±20% with respect to an effective ionic radius of 12-coordinated $Ba^{2+}$ (1.61 pm) or with respect to an effective ionic radius of 6-coordinated $Ti^{4+}$ (0.605 pm).

Also, an ionic valence of the element "M" is larger than that of the Ba or Ti.

By including the element "M" having the effective ion radius satisfying the above mentioned range, and having the above mentioned ionic valence, Ti ion can be reduced without occurring oxygen vacancy, because the element "M" is solid-soluted in the barium titanate, particularly in the hexagonal barium titanate. As a result, it is possible to suppress the descent of the specific permittivity even after the annealing treatment.

In the case in which the element "M" having an effective ionic radius which excesses the above mentioned range is included, the "M" cannot be solid-soluted in the barium titanate so that the effect of the present invention cannot be obtained.

In the barium titanate, normally, an ionic valence of Ba is 2, an ionic valence of titanium is 4. Therefore, an ionic valence of the element "M" is preferably larger than 2.

The element "M" is included in a content of more than 0 mole to 10 moles or less, preferably 0.02 mole or more to 5 moles or less, more preferably 0.03 mole or more to 1 mole or less with respect to 100 moles of the dielectric ceramic composition. When the content of the element "M" is too low, the effect of the present invention is likely not to be obtained. On the other hand, when the content of the element "M" is too large, an insulation characteristic tends to be decreased.

Also, in the present embodiment, the element "M" can be divided to "M1" having within ±20% of an effective ionic radius with respect to an effective ionic radius of 12-coordinated $Ba^{2+}$ and "M2" having within ±20% of an effective ionic radius with respect to an effective ionic radius of 6-coordinated $Ti^{4+}$. Then, the "M1" and "M2" can be shown as $(M1_xBa_{1-x})(M2_yTi_{1-y})O_3$ by using a generic formula.

The "x" in the formula shows content of "M1" which is $0<x\leq0.10$, is preferably $0.002\leq x\leq0.05$, is more preferably $0.003\leq x\leq0.01$. Also, the "y" in the formula shows content of "M2" which is $0<y\leq0.10$, preferably $0.002\leq x\leq0.05$, more preferably $0.003\leq x\leq0.01$. Note that $0<x+y\leq0.10$.

In this case, the ionic valence of the "M1" is preferably larger than 2 which is the ionic valence of the Ba, and is more preferably 3. Namely, the ionic valence of the "M1" is one larger than the ionic valence of the Ba.

Also, the ionic valence of the "M2" is preferably larger than 4 which is the ionic valence of the Ti, and is more preferably 5. Namely, the ionic valence of the "M2" is one larger than the ionic valence of the Ti.

The element "M" is preferably at least one selected from La, Ce, Bi and V. More preferably, La, Ce and V, further preferably La and Ce.

By having the element "M" included, with the above range, in the barium titanate having the hexagonal barium titanate as a main component, dielectric ceramic composition having extremely high specific permittivity (for example, 10000 or more) can be obtained even after annealing treatment.

The reasons that the dielectric ceramic composition shows such the extremely high specific permittivity and is able to maintain the specific permittivity even after the annealing treatment are considered as follows.

Firstly, the hexagonal barium titanate can be shown by a generic formula with using ionic valence as h-$Ba^{2+}Ti^{4+}O^{2-}_3$. When $M1^{3+}$ whose ionic valence is one larger than the $Ba^{2+}$ is included in the h-$Ba^{2+}Ti^{4+}O^{2-}_3$, a part of the $Ti^{4+}$ is reduced to compensate electric charge so that $Ti^{3+}$ is generated. Namely, it can be shown by a generic formula as h-$(Ba^{2+}_{1-x} M1^{3+}_{x})(Ti^{4+}_{1-x}Ti^{+}_{x})O^{2-}_{3}$.

By having such $M1^{3+}$ included in the hexagonal barium titanate, the $Ti^{3+}$ is generated, and performs electric conduction in the hexagonal barium titanate. Therefore, a region in which such $Ti^{3+}$ is generated becomes a region having semiconductor property. On the other hand, a region except for the region having the semiconductor property becomes a region of insulation. In this way, when the two regions which are different from electric property exist non-uniformly, the extremely high specific permittivity can be generated by a Maxwell-Wagner effect due to grain boundaries formed between these regions.

Although, it is considered that an extremely high specific permittivity shown by an oxygen-deficient hexagonal barium titanate is caused by the Maxwell-Wagner effect, in the present invention, $Ti^{3+}$ is generated by introducing $M1^{3+}$, not by the oxygen vacancy. Therefore, because the formed amount of $Ti^{3+}$ can be controlled by the content of $M1^{3+}$, thus it is possible to control the above mentioned specific permittivity occurrence. Further, in the dielectric ceramic composition of the present invention, when the annealing treatment is performed to the dielectric ceramic composition, the $Ti^{3+}$ is not oxidized and the above mentioned effect can be maintained, because the oxygen vacancy is not introduced. As a result, it is possible to maintain the extremely high specific permittivity.

In the above, although the Ti ion is reduced by introducing the $M1^{3+}$ to the hexagonal barium titanate, Ba ion may be reduced by introducing $M2^{5+}$ to the hexagonal barium titanate. Even in this case, extremely high specific permittivity can be maintained by the above mentioned Maxwell-Wagner effect.

Note that the effective ionic radi described in the present specification are the values based on a literature "R. D. Shannon, Acta Crystallogr., A32, 751 (1976)".

Producing Method of Dielectric Ceramic Composition

The dielectric ceramic composition of the present invention may be produced either as single crystal or polycrystal. In the present embodiment, it will be specified with respect to a method of producing dielectric ceramic composition of the present invention as a single crystal by FZ method (Floating Zone method).

Firstly, as for raw materials of the dielectric ceramic composition, a raw material of barium titanate and a raw material of element "M" are prepared.

As for the raw material of the barium titanate, barium titanate ($BaTiO_3$), oxides ($BaO$, $TiO_2$) to compose barium titanate and mixture thereof may be used. Further, various of compounds which becomes the above mentioned oxide and complex oxide by firing, for example, suitably selecting from carbonate, oxalate, nitrate, hydroxide, organometallic compounds may be used or by mixing. Specifically, as for a raw material for the barium titanate, $BaTiO_3$ may be used, $BaCO_3$ and $TiO_2$ may be used.

Also, as for a raw material for the element "M", compounds of the element "M" may be used, for example, suitably selecting from oxides, carbonate, oxalate, nitrate, hydroxide and organometallic compounds may be used or by mixing.

Next, the prepared raw materials of the dielectric ceramic composition are mixed, and binders which are normally used are added, then, performing compression molding (pressing) so as to obtain a forming body. This forming body is calcined under a predetermined temperature and holding time so that a calcined body is obtained. Although the calcining temperature and the calcining time are not particularly limited, these are preferably 1200 to 1500'C, 2 to 12 hours. The calcined body is a tetragonal barium titanate in which the element "M" is solid-soluted.

The calcined body is melted by FZ method with using an infrared ray image furnace 10 shown in FIG. 1 so as to form a dielectric ceramic composition in the form of single crystal. Specifically, at first, the above mentioned calcined body 20 is fixed between an upper shaft 12 and a lower shaft 13 in a quartz tube 11. Then, the upper shaft 12 and the lower shaft 13 are descended with rotating to a direction shown in FIG. 1 and introducing atmosphere gas. As for the atmosphere gas, $N_2+O_2$ gas is preferable.

In the infrared ray image furnace 10, a halogen lamp 14 shown in FIG. 1 is installed, the infrared ray from this lamp is reflected by a rotary ellipsoidal mirror 16 and concentrated to a melting zone 18 shown in FIG. 1. As a result, the melting zone 18 is heated to extremely high temperature, the calcined body 20 which passes through the melting zone 18 is melted and become a solvent medium and is contacted with a seed crystal (not shown), thus a single crystal dielectric ceramic composition 22 is produced when passing through the melting zone 18 with cooling.

Because the hexagonal barium titanate has a high temperature stable phase, a melting temperature is set at preferably 1460° C. or higher, further preferably 1600 to 1800° C. By melting at such temperature, the hexagonal barium titanate can be included in a content of preferably 90 mass % or more, further preferably 95 mass % or more with respect to a whole of the single crystal. However, depending on a producing condition, there is a case that a tetragonal or cubic barium titanate single crystal is included. Note that as regard to a growing speed, it is not particularly limited as far as the single crystal can be obtained. Although oxygen vacancy is introduced to the single crystal when the growing speed is comparatively faster, the oxygen can be replenished by the following annealing treatment.

Next, the annealing treatment is performed to the obtained single crystal dielectric ceramic composition. The annealing treatment is a process of reoxidazing the dielectric ceramic composition, reliability such as lifetime when used as products can be improved thereby. As for the annealing treatment condition, following condition is preferable. At first, as for the annealing atmosphere, air atmosphere is preferable. Also, a holding temperature when annealing is preferably 800 to 1000° C. and a holding time is preferably 0.5 to 10 hours. A temperature rising rate is preferably 10 to 1000° C./hour and a cooling rate is preferably 10 to 1000° C./hour. Also, as for annealing atmosphere gas, for example, it is preferable to use wet $N_2$ gas and the like.

By applying end face polishing with, for example, diamond paste and the like, and depositing Cu and the like, an electrode is formed on the single crystal dielectric ceramic composition obtained by the above.

The dielectric ceramic composition of the present embodiment produced by this manner is preferably used for electronic components such as an oxygen sensor, a semiconductor, a ceramic capacitor and the like.

As above, although it has been specified with respect to the embodiment of the present invention, the present invention is not limited to the above mentioned embodiment at all, and various modifications can be made within a scope of a gist of the present invention.

For example, in the above mentioned embodiment, although it was exemplified to produce the dielectric ceramic composition according to the present invention as a single crystal dielectric ceramic composition, it may be produced as polycrystal dielectric ceramic composition. As for a method of producing dielectric ceramic composition as polycrystal, a following mentioned method can be exemplified.

At first, as similar with a case for producing the single crystal dielectric ceramic composition, raw material powders are mixed and formed, a calcined body (tetragonal barium titanate in which the element "M" is solid-saluted) is produced. The polycrystal dielectric ceramic composition can be produced by filing the calcined body at 1450 to 1600° C. in a reducing atmosphere. Also, this can be used as powder by pulverizing.

EXAMPLES

Below, the present invention will be specified based on further detailed examples, however, the present invention is not limited to these examples.

Example 1

At first, $BaCO_3$ and $TiO_2$ were prepared as raw materials of barium titanate, and $La_2O_3$ was prepared as an oxide of element "M". These were mixed by a ball-mill so that "x" in a generic formula of $(Ba_{1-x}M1_x)(Ti_{1-y}M2_y)O_3$ satisfies 0 (sample 1), 0.001 (sample 2), 0.002 (sample 3), 0.003 (sample 4), 0.005 (sample 5a). Namely, La was included as M1, and M2 was not included. The obtained mixed powder was pressing formed at pressure of 180 MPa, a forming body of $\phi 8$ mm×100 mm was obtained. The forming body was calcined under a following calcining condition, a tetragonal barium titanate (calcined body) in which La is solid-soluted was produced.

The calcining condition was that temperature rising rate: 200° C./hour, holding temperature: 1300 to 1400° C., temperature holding time: 12 hours, cooling rate: 600° C./hour, atmosphere gas: air.

Next, the obtained calcined body was melted by FZ method with using an infrared ray image furnace so as to produce a single crystal. The producing condition was that melting temperature: 1700° C., growing speed: 15 mm/hour, atmosphere: $N_2+O_2$ gas.

As a result of investigation of the obtained single crystal, it was confirmed that La was included in a content of 0.1 to 0.5 mass % with respect to a whole of the barium titanate.

Next, a part of the obtained samples of rod-like single crystal dielectric ceramic composition was cut out as about 1 mm, a cut face was polished. Then, Cu was deposited as an electrode so that a sample of ceramic capacitor was obtained. Specific permittivity was measured by following mentioned method about respective capacitor samples.

Specific Permittivity ($\varepsilon s$)

A capacitance "C" was measured to a capacitor sample, under a criterion temperature 25° C., a signal of frequency 10 kHz, an input signal level (measured voltage) 1 Vrms was inputted by a digital LCR meter (4284A made by YHP). Then, the specific permittivity "$\varepsilon s$" (no unit) was calculated based on a thickness of the dielectric ceramic composition, an effective electrode area and the capacitance "C" obtained by the result of the above measurement. Results are shown in FIG. 2.

Then, the following annealing treatment was performed to the above mentioned rod-like single crystal to which the above mentioned specific permittivity was not measured.

The annealing condition was that temperature rising rate: 200° C./hour, holding temperature: 1000° C., temperature holding time: 0.5, 96, 144, 192, 240 hours, cooling rate: 200° C./hr, atmosphere gas: air.

Then, Cu was deposited as an electrode so that a sample of ceramic capacitor was obtained. The obtained capacitor sample size was a cylindrical of $\phi 5$ mm×1 mm.

The specific permittivity ($\varepsilon s$) was measured about the obtained capacitor sample by the above mentioned method. Results are shown in FIG. 2.

Example 2

Regarding the sample 5a, except for obtaining as polycrystal dielectric ceramic composition not single crystal, a calcined body was made as similar with the example 1, a capacitor sample 5b was produced and the specific permittivity before and after annealing treatment were measured. Results are shown in FIG. 2.

Example 3

Except for using $CeO_2$ as an oxide of M1 instead of $La_2O_3$, as similar with the example 1, capacitor samples were produced so that "x" in a generic formula of $(Ba_{1-x}M1_x)(Ti_{1-y}M2_y)O_3$ satisfies 0.003 (sample 6), 0.005 (sample 7), 0.010 (sample 8), and the specific permittivity before and after annealing treatment were measured. Results are shown in FIG. 2.

In FIG. 2, a sample in which the specific permittivity was measured without annealing treatment is the sample in which annealing treatment processing time is 0 h. From FIG. 2, regarding the specific permittivity before annealing treatment, it is confirmed that extremely high specific permittivity is occurred 100000 or more in samples including the sample (sample 1) in which the La is not included. Also, it is confirmed that the specific permittivity tends to become larger when increasing the content of La.

Further, when focused to the specific permittivity after annealing treatment, regarding the sample (sample 1) without including La, it is confirmed that the specific permittivity was lowered at three digits by only 30 minutes of annealing treatment.

On the other hand, in the samples (samples 2 to 5a) using single crystal dielectric ceramic composition in which La is included as 0.001 mole or more, the result was that the specific permittivity were almost unchanged by 30 minutes of the annealing treatment. Also, in the samples (samples 4 and 5a) in which La is included in a content of 0.003 or more, it is confirmed that the specific permittivity is not so lowered, even the annealing treatment was performed over 200 hours. Note that, the sample (sample 2) in which La is included in a content of 0.001 mole has same level specific permittivity with the sample 1 after annealing treatment of 96 hours, however, if it is performed for normal anneal treating time (less than 3 hours), descent of the specific permittivity is smaller than that of the sample 1.

Also, it is confirmed that the sample (sample 5b) in which the polycrystal dielectric ceramic composition was used has similar tendency with the example 1.

Further, it is confirmed that the samples (samples 6 to 8) in which Ce was used instead of La have similar tendency with the example 1.

The invention claimed is:
1. A dielectric ceramic composition comprising;
   a barium titanate including a barium titanate having hexagonal structure as a main component, and
   an element "M", wherein an effective ionic radius of said "M" is within ±20% with respect to an effective ionic radius of 12-coordinated $Ba^{2+}$ or with respect to an effective ionic radius of 6-coordinated $Ti^{4+}$, an ionic valence of said "M" is larger than an ionic valence of said Ba or Ti, and said "M" is at least one element selected from the group consisting of La and Ce.

2. The dielectric ceramic composition as set forth in claim 1, wherein said "M" is included in a content of more than 0 mole to 10 moles or less with respect to 100 moles of said dielectric ceramic composition.

3. The dielectric ceramic composition as set forth in claim 2, wherein said "M" is included in a content of not less than 0.002 moles to 0.05 moles or less with respect to 100 moles of said dielectric ceramic composition.

* * * * *